(12) United States Patent
Komaki

(10) Patent No.: US 7,256,620 B2
(45) Date of Patent: Aug. 14, 2007

(54) SELECTOR CIRCUIT AND SEMICONDUCTOR DEVICE

(75) Inventor: Masaki Komaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 234 days.

(21) Appl. No.: 11/052,523

(22) Filed: Feb. 8, 2005

(65) Prior Publication Data

US 2005/0166107 A1    Jul. 28, 2005

Related U.S. Application Data

(63) Continuation of application No. PCT/JP02/12431, filed on Nov. 28, 2002.

(51) Int. Cl.
*H03K 19/20* (2006.01)

(52) U.S. Cl. ..................... 326/119; 326/112

(58) Field of Classification Search ............. 326/37, 326/38, 46, 104, 105, 112, 119
See application file for complete search history.

(56) References Cited

U.S. PATENT DOCUMENTS 5,955,898 A * 9/1999 Sutherland et al. ......... 326/121

2003/0102894 A1* 6/2003 Lo et al. ..................... 327/116
2005/0280459 A1* 12/2005 Inoue ......................... 327/203

FOREIGN PATENT DOCUMENTS

| JP | 57-081644 | 5/1982 |
|---|---|---|
| JP | 04-284038 | 10/1992 |
| JP | 04-316113 | 11/1992 |
| JP | 05-291893 | 11/1993 |
| JP | 05-291895 | 11/1993 |
| JP | 08-316797 | 11/1996 |
| JP | 11-027109 | 1/1999 |
| JP | 11-068529 | 3/1999 |

* cited by examiner

*Primary Examiner*—Don Le
(74) *Attorney, Agent, or Firm*—Arent Fox LLP

(57) ABSTRACT

A selector circuit precisely outputs a signal selected from a plurality of signals. A latch circuit unit generates an internal selection control signal for controlling a selection operation of a selector circuit unit. When the levels of first and second data input signals do not match each other, the selector circuit unit maintains its selected state and does not perform a selecting operation based on the selection signal until the levels of the signals match each other in accordance with the internal selection control signal.

16 Claims, 5 Drawing Sheets

SELECTOR CIRCUIT AND SEMICONDUCTOR DEVICE

CROSS-REFERENCE TO RELATED APPLICATIONS

This application is a continuation of International Patent Application No. PCT/JP02/012431, filed Nov. 28, 2002, the entire contents being incorporated herein by reference.

BACKGROUND OF THE INVENTION

The present invention relates to a selector circuit and a semiconductor device, and more particularly, to a selector circuit for selecting a given signal from a plurality of signals, and to a semiconductor device on which the selector circuit is mounted.

In recent years, semiconductor devices (LSIs) have been highly integrated and become multifunctional, and signals used therein have also been diversified. A selector circuit, which selects a given signal from a plurality of input signals and outputs the selected signal, is mounted on such an LSI. A subsequent circuit connected to the selector circuit operates according to an output signal of the selector circuit. Thus, the selector circuit is required to correctly propagate the waveform of its selected input signal to the subsequent circuit.

Conventional selector circuits have, for example, the structures shown in FIGS. 3 to 5.

FIG. 3 is a circuit diagram showing a selector circuit according to a first conventional example. The selector circuit 51 is, for example, a two-input selector circuit that uses two transfer gates (also referred to as transmission gates). The selector circuit 51 selects one of first and second data input signals IN1 and IN2 based on an externally input selection signal S, and outputs the selected signal. Each transfer gate is formed by connecting, for example, a P-channel metal oxide semiconductor (PMOS) transistor and an N-channel metal oxide semiconductor (NMOS) transistor in parallel.

In detail, in the selector circuit 51, the first data input signal IN1 is input into an input terminal of the first transfer gate 53 via an inverter circuit 52, and the second data input signal IN2 is input into an input terminal of the second transfer gate 55 via an inverter circuit 54. An output terminal of each of the transfer gates 53 and 55 is connected to an inverter circuit 56.

The first and second transfer gates 53 and 55 described above are controlled on and off complementarily, based on the externally input selection signal S. To be specific, the selection signal S is used to generate an internal selection control signal sn via an inverter circuit 57. The signal sn is input into the gate of the NMOS transistor included in the first transfer gate 53, and the gate of the PMOS transistor included in the second transfer gate 55. Also, the selection signal S is used to generate an internal selection control signal sp via the inverter circuit 57 and an inverter circuit 58. The signal sp is input into the gate of the PMOS transistor included in the first transfer gate 53, and the gate of the NMOS transistor included in the second transfer gate 55.

When the selection signal S is input at a low (L) level, the first transfer gate 53 is turned on and the second transfer gate 55 is turned off, so that the selector circuit 51 outputs the first data input signal IN1 as its output signal OUT. When the selection signal S at a high (H) level is input, the first transfer gate 53 is turned off and the second transfer gate 55 is turned on, so that the selector circuit 51 outputs the second data input signal IN2 as its output signal OUT.

FIG. 4 is a circuit diagram showing a selector circuit according to a second conventional example. The selector circuit 61 is, for example, a two-input selector circuit that uses a complex gate. In the same manner as described above, the selector circuit 61 selects one of first and second data input signals IN1 and IN2 based on an externally input selection signal S, and outputs the selected signal.

The complex gate is formed by first and second AND circuits 62 and 63 and a NOR circuit 64 (more precisely, a two-input NOR circuit having an AND function). An output terminal of the NOR circuit 64 is connected to an inverter circuit 65. The first data input signal IN1 is input into one input terminal of the first AND circuit 62. The selection signal S is input, as an internal selection control signal sn, into the other input terminal of the first AND circuit 62 via an inverter circuit 66. The second data input signal IN2 is input into one input terminal of the second AND circuit 63. The selection signal S (signal substantially the same as the internal selection control signal sp) is input into the other input terminal of the second AND circuit 63. In the same manner as described above, the selector circuit 61 outputs the first data input signal IN1 when the selection signal S is input at an L level, and outputs the second data input signal IN2 when the selection signal S at an H level is input.

FIG. 5 is a circuit diagram showing a selector circuit according to a third conventional example. The selector circuit 71 is shown as a selector circuit formed by using another complex gate. The complex gate is formed by first and second OR circuits 72 and 73 and a NAND circuit 74 (more precisely, a two-input NAND circuit having an OR function). An output terminal of the NAND circuit 74 is connected to an inverter circuit 75. A selection signal S (signal substantially the same as the internal selection control signal sp) is input into the first OR circuit 72. The selection signal S is input, as an internal selection control signal sn, into the second OR circuit 73 via an inverter circuit 76. In the same manner as described above, the selector circuit 71 with this structure also outputs a first data input signal IN1 when the selection signal S at an L level is input, and outputs a second data input signal IN2 when the selection signal S at an H level is input.

In the selector circuits 51, 61, and 71 according to the first to third conventional examples described above, the first and second data input signals IN1 and IN2, which are input therein, are signals asynchronous to each other having different frequencies. Thus, as shown in FIG. 6, a spike pulse waveform (hazard), a waveform with a short pulse width, etc. may appear in the output signal OUT, depending on the timing at which the selection signal S transits (transits to an H level or to an L level).

Such a defective pulse waveform (e.g. hazard) causes a subsequent circuit, which operates upon receipt of the signal, to malfunction. In particular, when the selector circuit is used for selecting clock signals, appearance of such a defective pulse waveform (e.g. hazard) has an influence on the operation of the subsequent logical circuit. Here, although FIG. 6 shows the case in which the first data input signal IN1 has a higher frequency than that of the second data input signal IN2, the same problem occurs also when the second data input signal IN2 has a higher frequency than that of the first data input signal IN1.

To solve this problem, the structures disclosed, for example, in Japanese Laid-Open Patent Publication Nos. 4-316113 and 5-291895, and the structure shown in FIG. 7 are conventionally proposed.

FIG. 7 is a circuit diagram showing a selector circuit according to a fourth conventional example. The selector circuit 81 includes a selector circuit unit 82, an EOR circuit 83, and a latch circuit unit 84.

In the same manner as described for the first conventional example (refer to FIG. 3), the selector circuit unit 82 is formed by using transfer gates. The selector circuit unit 82 selects one of first and second data input signals IN1 and IN2 based on a selection control signal sel, which is output from the latch circuit unit 84. The EOR circuit 83 determines whether the levels (transiting states) of the first and second data input signals IN1 and IN2 match. The EOR circuit 83 outputs an L level determination signal eq when the signal levels match, and outputs an H level determination signal eq when the signal levels do not match.

According to the determination signal eq, the latch circuit unit 84 propagates an externally input selection signal S and generates a selection control signal sel, or interrupts the input selection signal S and generates a selection control signal sel maintained at its output level. In detail, the latch circuit unit 84 generates internal control signals gn and gp based on the determination signal eq from the EOR circuit 83, and controls its two transfer gates 91 and 92 on and off complementarily, based on the signals gn and gp.

The latch circuit unit 84 propagates the externally input selection signal S and outputs the selection control signal sel in response to the determination signal eq at an L level (indicating that the levels of the signals IN1 and IN2 match). The latch circuit unit 84 interrupts the externally input selection signal S and maintains the selection control signal sel at its output level in response to the determination signal eq at an H level (indicating that the levels of the signals IN1 and IN2 do not match).

In other words, the latch circuit unit 84 propagates the transition of the selection signal S using the selection control signal sel only when the first and second data input signals IN1 and IN2 are both at an H level or both at an L level, i.e., only when the levels of the signals match. The selector circuit unit 82 performs a selection operation in response to the signal sel. This prevents a hazard or a waveform with an insufficient pulse width described above from appearing in the output signal OUT of the selector circuit unit 82.

SUMMARY OF THE INVENTION

In the selector circuit 81 according to the fourth conventional example described above, the latch circuit unit 84 generates the selection control signal sel in response to the determination signal eq from the EOR circuit 83. A problem here is that a gate delay in the EOR circuit 83 and in the latch circuit unit 84 causes a delay in outputting the selection control signal sel. Further, the EOR circuit 83 and the latch circuit unit 84 are formed as separate logical cells. A wiring delay of a signal line connecting the cells also causes a delay in outputting the selection control signal sel.

For example, as shown in FIG. 8, the selection signal S now transits from an L level to an H level, so that the second data input signal IN2 falls, and the first and second data input signals IN1 and IN2 are both at an L level.

Here, the L level determination signal eq to be output from the EOR circuit 83 is delayed. The selection control signal sel to be output from the latch circuit unit 84 in response to the determination signal eq is also delayed. As a result, the timing at which the selection control signal sel transits is delayed. This may cause an unintended pulse of the first data input signal IN1 (a dashed line for the signal OUT in FIG. 8.) to be output.

Further, such a gate delay or a wiring delay may conventionally cause a defect in propagation of the selection signal S when, for example, an interval between the falling edge of the second data input signal IN2 and the rising edge of the first data input signal IN1 is narrow (a dashed line for the signal IN2 in FIG. 8).

In this case, a delay of the determination signal eq to be output from the EOR circuit 83 (a dashed line for the signal eq in FIG. 8) causes the latch circuit unit 84 to fail to propagate the transit of the selection signal S. As a result, the latch circuit unit 84 maintains the L level selection control signal sel (a dashed line for the signal sel in FIG. 8). In the same manner as described above, this may cause an unintended pulse of the first data input signal IN1 (a dashed line for the signal OUT in FIG. 8) to be output.

In the same manner as described for the selector circuits according to the first to third conventional examples, the selector circuit 81 according to the fourth conventional example also has the problem of having an influence on the operation of a subsequent circuit, which uses an output of the selector circuit 81. Further, a gate delay or a wiring delay described above lowers the operation speed of the selector circuit.

This problem also occurs in the structures disclosed in Japanese Laid-Open Patent Publication Nos. 4-316113 and 5-291895. Further, the structures disclosed in these publications and the structure according to the fourth conventional example are realized by combining a large number of logical circuits (logical cells). Thus, these conventional structures have another problem of circuit redundancies and larger circuit scales.

The present invention provides a selector circuit and a semiconductor device that precisely output a signal selected from a plurality of signals.

A first embodiment of the present invention provides a selector circuit. The selector circuit includes a selector circuit unit, which selects one of a plurality of signals in accordance with a selection signal, and a selection control circuit connected to the selector circuit unit, which generates, when the levels of the plurality of signals do not match one another, an internal selection control signal for controlling a selection operation of the selector circuit unit to maintain a state that is being selected in the selector circuit unit and not to perform a switching operation based on the selection signal until the levels of the plurality of signals match one another.

A second embodiment of the present invention provides a semiconductor device. The semiconductor device includes a selector circuit that includes a selector circuit unit, which selects one of a plurality of signals in accordance with a selection signal, and a selection control circuit connected to the selector circuit unit, which generates, when the levels of the plurality of signals do not match one another, an internal selection control signal for controlling a selection operation of the selector circuit unit to maintain a state that is being selected in the selector circuit unit and not to perform a switching operation based on the selection signal until the levels of the plurality of signals match one another.

DETAILED DESCRIPTION OF THE PREFERRED EMBODIMENTS

Figure 1:
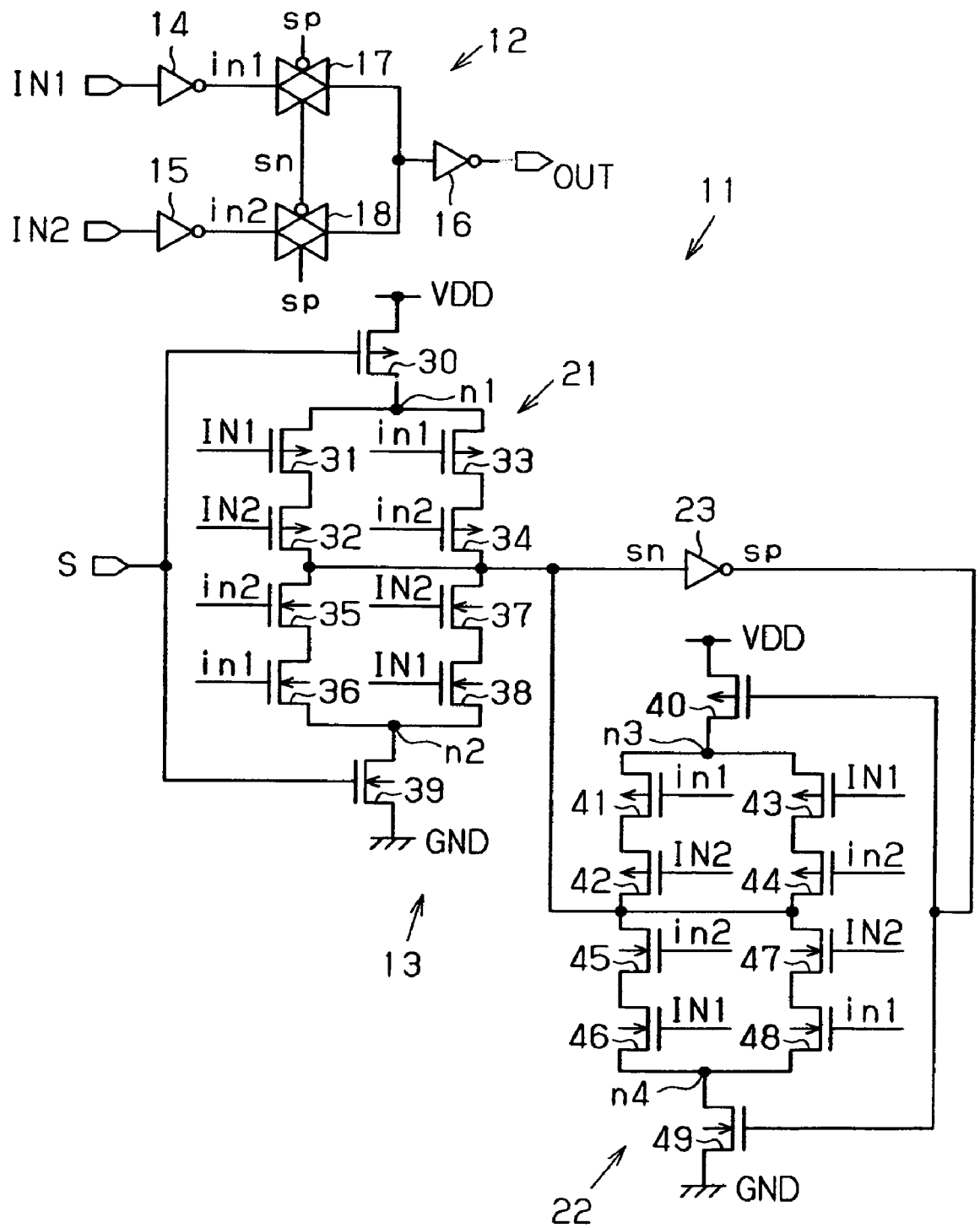
FIG. 1 is a schematic circuit diagram showing a selector circuit according to a preferred embodiment of the present invention.
Figure 2:
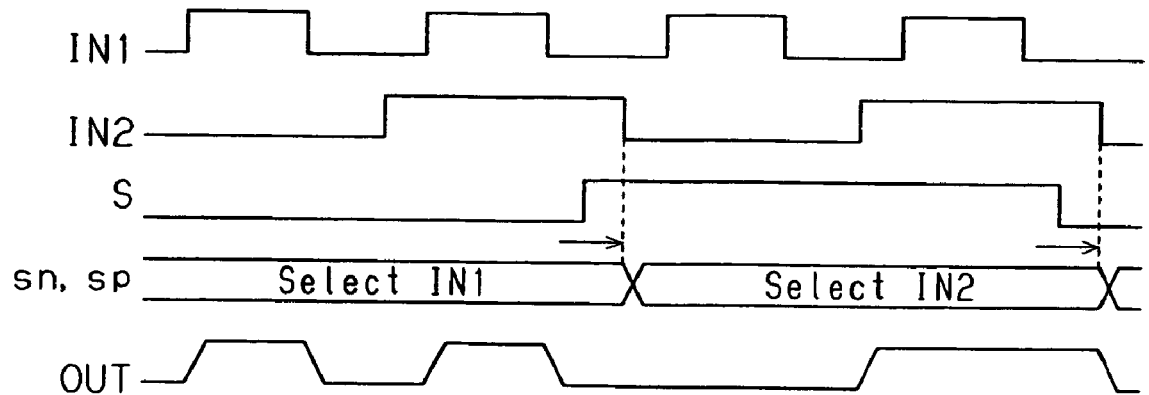
FIG. 2 is an operation waveform diagram of the selector circuit of FIG. 1.
Figure 3:
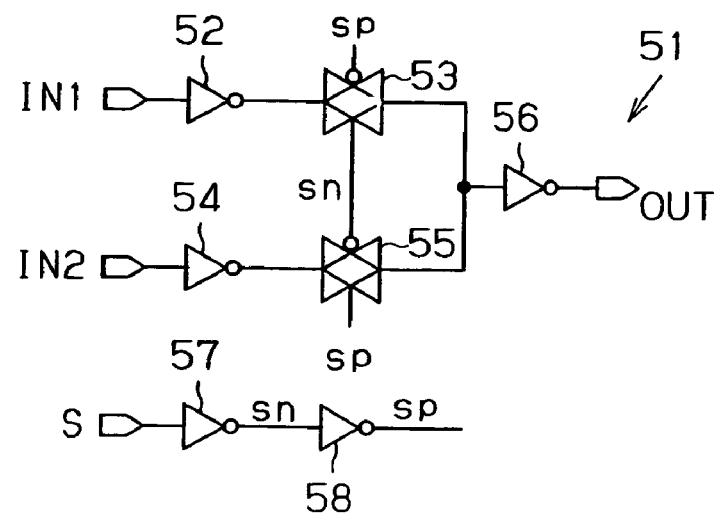
FIG. 3 is a schematic circuit diagram showing a selector circuit according to a first conventional example.

The following describes a selector circuit to be mounted on a semiconductor device, as a preferred embodiment of the present invention, with reference to FIGS. 1 and 2.

FIG. 1 is a circuit diagram showing a selector circuit according to one embodiment of the present invention.

The selector circuit 11 includes a selector circuit unit 12, which selects one of first and second data input signals IN1 and IN2 according to an externally input selection signal S and outputs the selected signal, and a latch circuit unit 13, which generates first and second internal selection control signals (hereafter referred to as "internal selection signals") sn and sp based on the selection signal S.

The selector circuit unit 12 is formed by inverter circuits 14 to 16, and first and second transfer gates 17 and 18. Each of the transfer gates 17 and 18 is formed by, for example, connecting a PMOS transistor and an NMOS transistor (not shown) in parallel.

An inversion signal in1, which is obtained by inverting the first data input signal IN1 via the inverter circuit 14, is input into an input terminal of the first transfer gate 17. An inversion signal in2, which is obtained by inverting the second data input signal IN2 via the inverter circuit 15, is input into an input terminal of the second transfer gate 18. An output terminal of each of the transfer gates 17 and 18 is connected to the inverter circuit 16.

The first and second transfer gates 17 and 18 described above are controlled on and off complementarily, based on the first and second internal selection signals sn and sp, which are generated by the latch circuit unit 13. The internal selection signals sn and sp are signals inverted from each other via an inverter circuit included in the latch circuit unit 13 described later. The first internal selection signal sn is input into the gate of the NMOS transistor included in the first transfer gate 17, and the gate of the PMOS transistor included in the second transfer gate 18. The second internal selection signal sp is input into the gate of the PMOS transistor included in the first transfer gate 17, and the gate of the NMOS transistor included in the second transfer gate 18.

The selector circuit unit 12 outputs, as an output signal OUT, the signal propagated via one of the first and second transfer gates 17 and 18 that is brought into conduction based on the internal selection signals sn and sp.

The latch circuit unit 13 includes first and second signal propagation circuits 21 and 22, and an inverter circuit 23. The first signal propagation circuit 21 propagates the selection signal S, which is externally input, via its internal inverter circuit unit described later, and generates the first internal selection signal sn. The inverter circuit 23 inverts the first internal selection signal sn to generate the second internal selection signal sp.

The second signal propagation circuit 22 propagates the second internal selection signal sp, which is output from the inverter circuit 23, via its internal inverter circuit unit described later, and generates the first internal selection signal sn. The first internal selection signal sn output from the second signal propagation circuit 22 is input as feedback into the inverter circuit 23.

The following first describes the first signal propagation circuit 21 in detail.

The first signal propagation circuit 21 includes five transistors 30 to 34, which are formed by PMOS transistors, and five transistors 35 to 39, which are formed by NMOS transistors. In the present embodiment, among the transistors 30 to 39, the transistors 30 and 39 function as an inverter circuit unit (first inverter circuit unit), and the transistors 31 to 38 function as a switching circuit (first switching circuit) for driving the inverter circuit unit.

The transistor 30 has its source connected to a power supply VDD, and its drain connected to the sources of the transistors 31 and 33. The transistor 39 has its source connected to a ground GND, and its drain connected to the sources of the transistors 36 and 38. The transistors 31, 32, 35, and 36 are connected in series. The transistors 33, 34, 37, and 38 are connected in series. The drains of the transistors 32 and 35 and the drains of the transistors 34 and 37 are connected to each other, and also are connected to an input terminal of the inverter circuit 23.

In the transistors 30 to 39 connected in this way, the selection signal S is input into the gates of the transistors 30 and 39, the first data input signal IN1 is input into the gates of the transistor 31 and 38, and the second data input signal IN2 is input into the gates of the transistors 32 and 37. Also, an inversion signal in1 of the first data input signal IN1 is input into the gates of the transistors 33 and 36, and an inversion signal in2 of the second data input signal IN2 is input into the gates of the transistors 34 and 35.

When the first and second data input signals IN1 and IN2 are both at an L level and so their states match (IN1=IN2=0), a first transistor group consisting of the transistors 31, 32, 35, and 36 is turned on, so that the drains of the transistors 30 and 39 are brought into conduction. In other words, the first signal propagation circuit 21 here drives the transistors 30 and 39, which function as an inverter circuit unit, to invert the selection signal S and generate the first internal selection signal sn.

When the first and second data input signals IN1 and IN2 are both at an H level and so their states match (IN1=IN2=1), a second transistor group consisting of the transistors 33, 34, 37, and 38 is turned on, so that the drains of the transistors 30 and 39 are brought into conduction. In other words, the first signal propagation circuit 21 here drives the transistors 30 and 39, to invert the selection signal S and generate the first internal selection signal sn, in the same manner as described above.

When the first data input signal IN1 is at an L level and the second data input signal IN2 is at an H level and so their states do not match (IN1=0≠IN2=1), the transistors 32, 33, 35, and 38 are turned off, so that an output terminal of the first signal propagation circuit 21 enters into a high impedance state. In other words, the first signal propagation circuit 21 here does not propagate the selection signal S.

When the first data input signal IN1 is at an H level and the second data input signal IN2 is at an L level and so their states do not match (IN1=1≠IN2=0), the transistors 31, 34, 36, and 37 are turned off, so that the output terminal of the first signal propagation circuit 21 enters into a high impedance state in the same manner. In other words, the first signal propagation circuit 21 here does not propagate the selection signal S.

Next, the following describes the second signal propagation circuit 22 in detail.

The second signal propagation circuit 22 includes five transistors 40 to 44, which are formed by PMOS transistors, and five transistors 45 to 49, which are formed by NMOS transistors. In the present embodiment, among the transistors 40 to 49, the transistors 40 and 49 function as an inverter circuit unit (second inverter circuit unit) and the transistors 41 to 48 function as a switching circuit (second switching circuit) for driving the inverter circuit unit.

The transistor 40 has its source connected to a power supply VDD, and its drain connected to the sources of the transistors 41 and 43. The transistor 49 has its source connected to a ground GND, and its drain connected to the sources of the transistors 46 and 48. The transistors 41, 42, 45, and 46 are connected in series. The transistors 43, 44, 47, and 48 are connected in series. The drains of the transistors 42 and 45 and the drains of the transistors 44 and 47 are connected to each other, and also are connected to the input terminal of the inverter circuit 23.

In the transistors 40 to 49 connected in this way, the second internal selection signal sp, which is output from the inverter circuit 23, is input into the gates of the transistors 40 and 49, the first data input signal IN1 is input into the gates of the transistors 43 and 46, and the second data input signal IN2 is input into the gates of the transistor 42 and 47. Also, the inversion signal in1 of the first data input signal IN1 is input into the gates of the transistors 41 and 48, and the inversion signal in2 of the second data input signal IN2 is input into the gates of the transistors 44 and 45.

When the first and second data input signals IN1 and IN2 are both at an L level and so their states match (IN1=IN2=0), the transistors 41, 44, 46, and 47 are turned off, so that an output terminal of the second signal propagation circuit 22 enters into a high impedance state. In other words, the second signal propagation circuit 22 here does not propagate the second internal selection signal sp.

When the first and second data input signals IN1 and IN2 are both at an H level and so their states match (IN1=IN2=1), the transistors 42, 43, 45, and 48 are turned off, so that the output terminal of the second signal propagation circuit 22 enters into a high impedance state in the same manner. In other words, the second signal propagation circuit 22 here does not propagate the second internal selection signal sp.

When the first data input signal IN1 is at an L level and the second data input signal IN2 is at an H level and so their states do not match (IN1=0≠IN2=1), a third transistor group consisting of the transistors 43, 44, 47, and 48 is turned on, so that the drains of the transistors 40 and 49 are brought into conduction. In other words, the second signal propagation circuit 22 here drives the transistors 40 and 49, which function as an inverter circuit unit, to invert the second internal selection signal sp and generate the first internal selection signal sn.

When the first data input signal IN1 is at an H level and the second data input signal IN2 is at an L level and so their states do not match (IN1=1≠IN2=0), a fourth transistor group consisting of the transistors 41, 42, 45, and 46 is turned on, so that the drains of the transistors 40 and 49 are brought into conduction. In other words, the second signal propagation circuit 22 here drives the transistors 40 and 49 to invert the second internal selection signal sp and generate the first internal selection signal sn in the same manner as described above.

The latch circuit unit 13 with the above-described structure drives the first signal propagation circuit 21 substantially as an inverter circuit unit and interrupts the second signal propagation circuit 22 when the levels (transiting states) of the first and second data input signals IN1 and IN2 match. As a result, the latch circuit unit 13 propagates the selection signal S via the first signal propagation circuit 21 and the inverter circuit 23, and provides the selector circuit unit 12 with the first and second internal selection signals sn and sp, which are generated via the first signal propagation circuit 21 and the inverter circuit 23.

The latch circuit unit 13 interrupts the first signal propagation circuit 21 and drives the second signal propagation circuit 22 substantially as an inverter circuit unit when the levels of the first and second data input signals IN1 and IN2 do not match. As a result, the latch circuit unit 13 interrupts propagation of the selection signal S, and maintains the first and second internal selection signals sn and sp at their output levels via the inverter circuit 23 and the second signal propagation circuit 22.

FIG. 2 is a waveform diagram showing an example of the operation of the selector circuit 11 of the present embodiment. As one example, the following describes the case in which the first data input signal IN1 has a higher frequency than that of the second data input signal IN2.

Now, an L level selection signal S is input into the latch circuit unit 13, and the selector circuit unit 12 selects and outputs the first data input signal IN1. Then, the selection signal S transits from an L level to an H level. Here, with the first data input signal IN1 being at an L level and the second data input signal IN2 being at an H level (IN1≠IN2), the latch circuit unit 13 maintains the first and second internal selection signals sn and sp at the time of output. Then, the latch circuit unit 13 generates the first and second internal selection signals sn and sp corresponding to the H level selection signal S, in response to the next falling edge of the second data input signal IN2 (IN1=IN2). This causes the selector circuit unit 12 to select and output the second data input signal IN2.

In the same manner, when the selection signal S transits from an H level to an L level, the first and second internal selection signals sn and sp are maintained until the states of the signals IN1 and IN2 match. After the states of the signals IN1 and IN2 match, the first data input signal IN1 is selected.

In this way, with the first and second data input signals IN1 and IN2 matching, the input signals are switched. This prevents a hazard or a waveform with a short pulse width from appearing in the output signal of the selector circuit unit 12.

Further, in the selector circuit 11 of the present embodiment, the first and second signal propagation circuits 21 and 22 included in the latch circuit unit 13 perform, in parallel, the determination operation as to whether the first and second data input signals IN1 and IN2 match. Thus, the selector circuit 11 has a reduced circuit scale compared with when the selector circuit 11 is realized by combining a large number of logical cells. Further, the selector circuit 11 has a reduced influence of a gate delay occurring in each logical cell or a wiring delay occurring in a signal line connecting the logical cells.

The selector circuit of the preferred embodiment of the present invention has the following advantages.

(1) The latch circuit unit 13 interrupts the selection signal S when the states of the first and second data input signals IN1 and IN2 do not match, and maintains the first and second internal selection signals sn and sp to be provided to the selector circuit unit 12 at their output levels until the states of the signals IN1 and IN2 match each other. Thus, the latch circuit unit 13 propagates the selection signal S and enables the selector circuit unit 12 to perform a switching operation based on the selection signal S only when the signals IN1 and IN2 match each other. This prevents a hazard or a waveform with an insufficient pulse width from appearing in the output signal OUT of the selector circuit unit 12. As a result, this prevents a subsequent logical circuit etc., which operates upon receipt of an output signal of the selector circuit 11, from malfunctioning.

(2) The latch circuit unit 13 also has the function of determining whether the first and second data input signals IN1 and IN2 match. Thus, the selector circuit 11 is not required to include a logical circuit dedicated to this determination. The selector circuit 11 has a reduced circuit scale.

(3) The selector circuit 11 includes a reduced number of circuits, and so has a reduced influence of a gate delay or a wiring delay on the first and second internal selection signals sn and sp to be provided to the selector circuit unit 12. This prevents an unintended and unnecessary pulse, which would otherwise be generated by such delays, from appearing in the output signal OUT of the selector circuit unit 12. As a result, this prevents the subsequent circuit from malfunctioning.

(4) With a reduced influence of a gate delay or a wiring delay, the operation speed of the selector circuit 11 is improved.

(5) The first signal propagation circuit 21 is formed only by the plurality of transistors 30 to 39, which invert the selection signal S and propagate the inverted signal when the first and second data input signals IN1 and IN2 match. In this way, the first signal propagation circuit 21 is realized by an extremely simple structure.

(6) The second signal propagation circuit 22 is formed only by the plurality of transistors 40 to 49, which invert the second internal selection signal sp and propagate the inverted signal when the first and second data input signals IN1 and IN2 do not match. In this way, the second signal propagation circuit 22 is realized by an extremely simple structure.

The above embodiment may be modified in the following forms.

In the above embodiment, the present invention is embodied as the two-input selector circuit 11, which selects and outputs one of the first and second data input signals IN1 and IN2. However, the present invention may be embodiment as a selector circuit with three or more inputs.

In the above embodiment, the first signal propagation circuit 21 is formed so that the drains (nodes n1 and n2 shown in FIG. 1) of the transistors 30 and 39, which function as an inverter circuit, are separated from each other. However, the nodes n1 and n2 may be connected to each other. In this case, a switching circuit formed by the first transistor group (transistors 31, 32, 35, and 36) and the second transistor group (transistors 33, 34, 37, and 38) is connected to an input stage or an output stage of the inverter circuit unit formed by the transistors 30 and 39. To be specific, for example, the drains (nodes n1 and n2) of the transistors 30 and 39 are connected to each other, and the connecting terminal thereof is connected to the sources of the transistors 31 and 33. Then, the sources of the transistors 36 and 38 are connected to the input terminal of the inverter circuit 23. With this structure, too, in the same manner as described in the above embodiment, the internal selection control signal sn output via the inverter circuit unit formed by the transistors 30 and 39 is propagated or interrupted based on the states of the signals IN1, IN2, in1, and in2, which are input into the first and second transistor groups.

In the above embodiment, the second signal propagation circuit 22 is formed so that the drains (nodes n3 and n4 shown in FIG. 1) of the transistors 40 and 49, which function as an inverter circuit, are separated from each other. However, the nodes n3 and n4 may be connected to each other. In this case, a switching circuit formed by the third transistor group (transistors 41, 42, 45, and 46) and the fourth transistor group (transistors 43, 44, 47, and 48) is connected to an input stage or an output stage of the inverter circuit unit formed by the transistors 40 and 49. To be specific, for example, the drains (nodes n3 and n4) of the transistors 40 and 49 are connected to each other, and the connecting terminal thereof is connected to the sources of the transistors 41 and 43. Then, the sources of the transistors 46 and 48 are connected to the input terminal of the inverter circuit 23. With this structure, too, in the same manner as described in the above embodiment, the internal selection control signal sn output via the inverter circuit unit formed by the transistors 40 and 49 is propagated or interrupted based on the states of the signals IN1, IN2, in1, and in2, which are input into the third and fourth transistor groups.

In the above embodiment, the second signal propagation circuit 22 may not include the transistors 41 to 48 but may be an inverter circuit formed only by the transistors 40 and 49. In this case, it is preferable that the transistors 40 and 49 be formed by transistors with relatively small driving capability.

Figure 4:
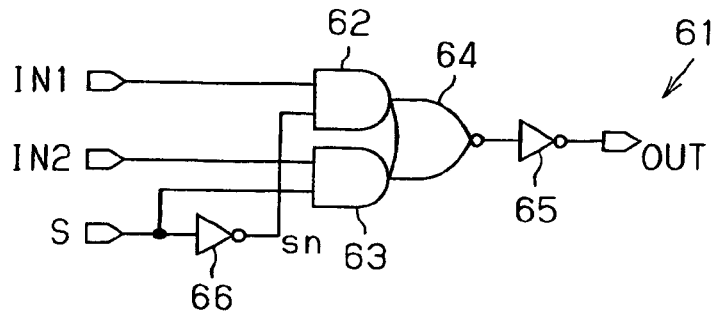
FIG. 4 is a schematic circuit diagram showing a selector circuit according to a second conventional example.
Figure 5:
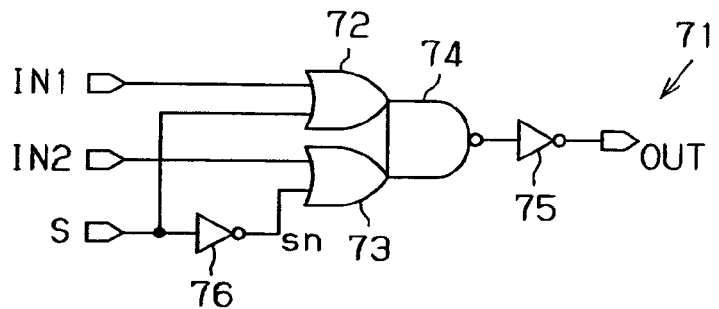
FIG. 5 is a schematic circuit diagram showing a selector circuit according to a third conventional example.
Figure 6:
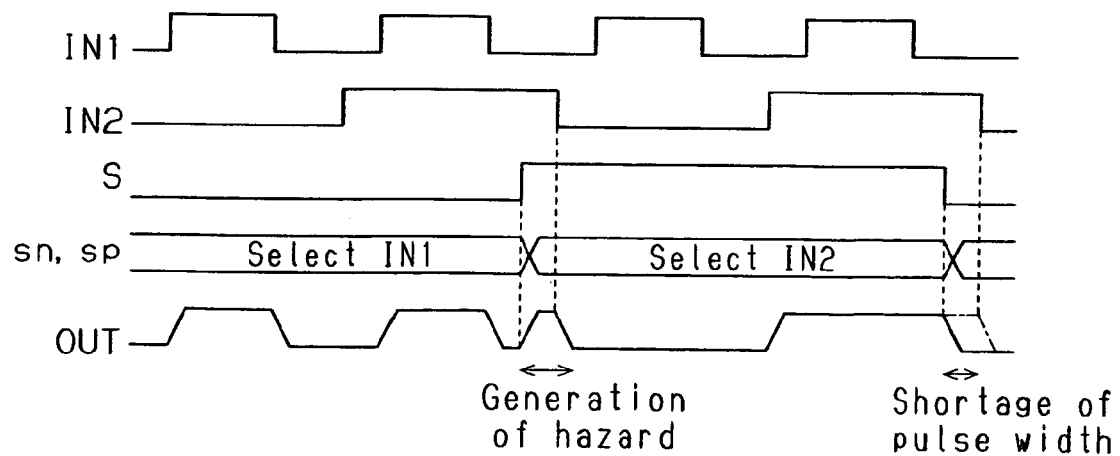
FIG. 6 is an operation waveform diagram of the selector circuits according to the conventional examples.
Figure 7:
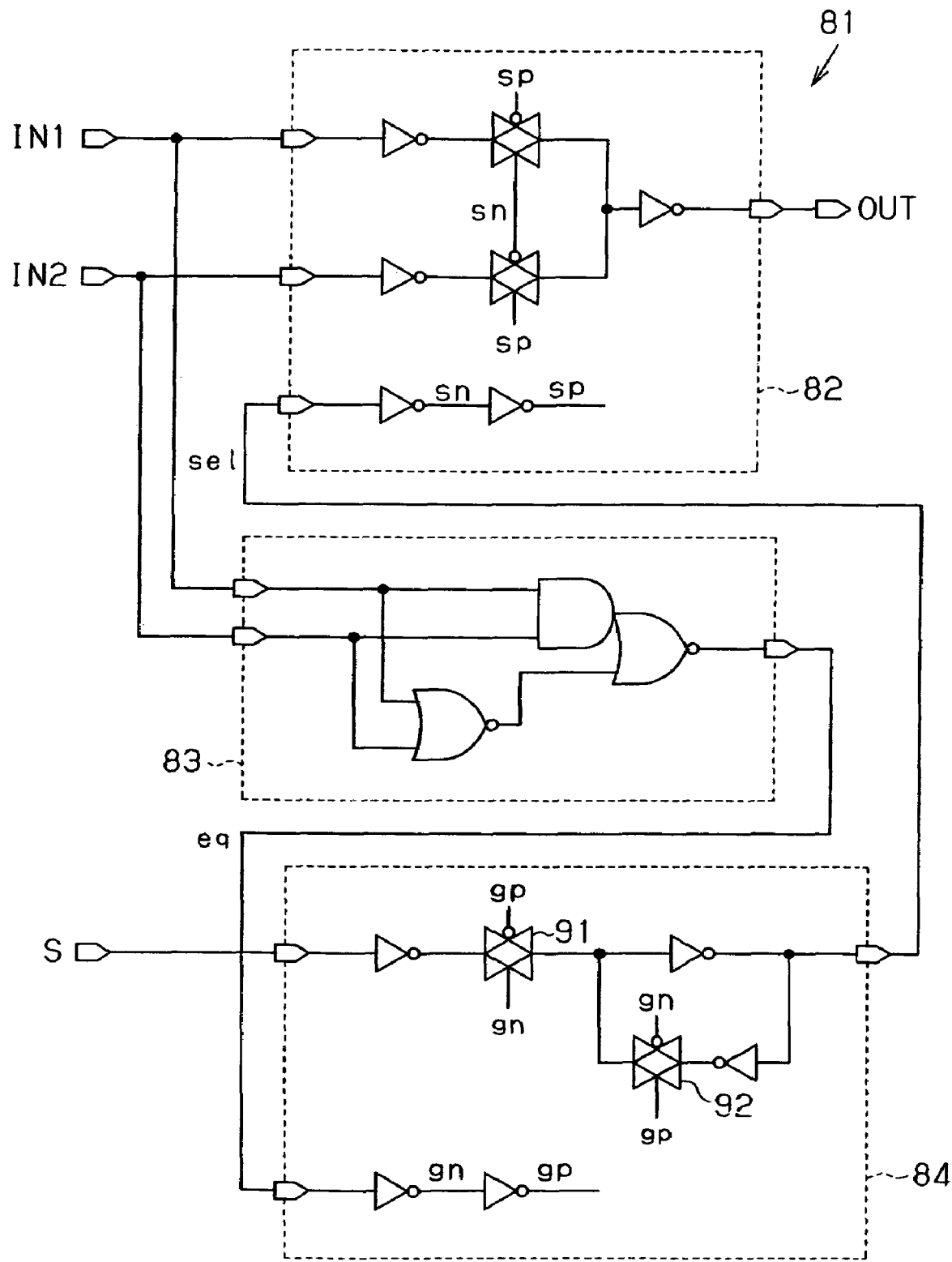
FIG. 7 is a schematic circuit diagram showing a selector circuit according to a fourth conventional example.
Figure 8:
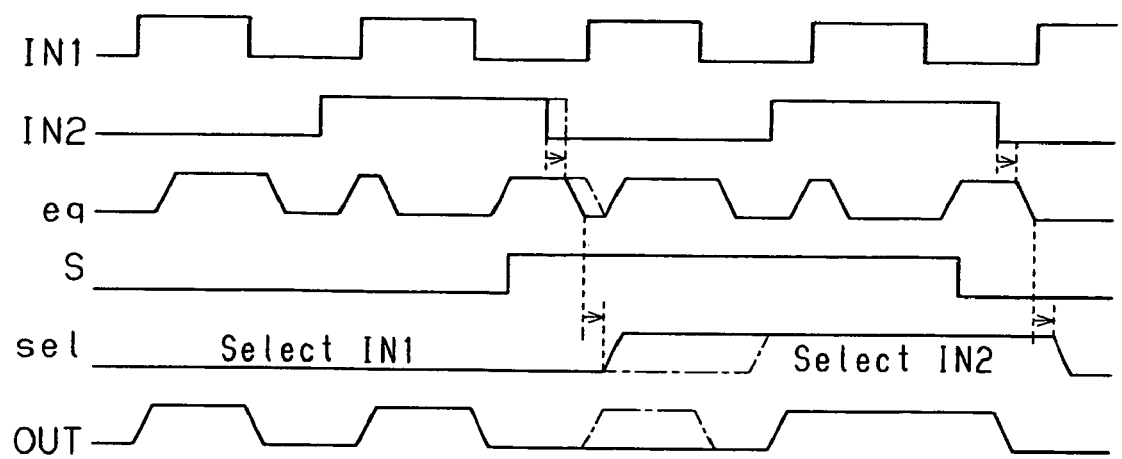
FIG. 8 is an operation waveform diagram of the selector circuit of FIG. 7.

The structure of the selector circuit unit 12 should not be limited to the structure shown in FIG. 1, but may be other structures. To be specific, although the selector circuit unit 12 in the above embodiment is formed by using the transfer gates 17 and 18, the selector circuit unit 12 may be formed by using the complex gates shown in FIGS. 4 and 5.

The present examples and embodiments are to be considered as illustrative and not restrictive, and the invention is not to be limited to the details given herein, but may be modified within the scope and equivalence of the appended claims.

What is claimed is:

1. A selector circuit comprising:
a selector circuit unit for selecting one of a plurality of signals in accordance with a selection signal; and
a selection control circuit, connected to the selector circuit unit, for generating, when levels of the plurality of signals do not match one another, an internal selection control signal for controlling a selection operation of the selector circuit unit to maintain a state that is being selected in the selector circuit unit and not to perform a switching operation based on the selection signal until the levels of the plurality of signals match one another,
wherein the selection control circuit propagates the selection signal and generates an internal selection control signal having a level corresponding to the selection signal when the levels of the plurality of signals match one another, and interrupts propagation of the selection signal and maintains the level of the internal selection control signal to be provided to the selector circuit unit until the levels of the plurality of signals match one another when the levels of the plurality of signals do not match one another.

2. The selector circuit of claim 1, wherein the internal selection control signal is one of two signals having levels complementary to each other, for causing one of the plurality of signals to be selectively output from the selector circuit unit.

3. A selector circuit comprising:
a selector circuit unit for selecting one of a plurality of signals in accordance with a selection signal; and
a selection control circuit, connected to the selector circuit unit, for generating, when levels of the plurality of signals do not match one another, an internal selection control signal for controlling a selection operation of the selector circuit unit to maintain a state that is being selected in the selector circuit unit and not to perform a switching operation based on the selection signal until the levels of the plurality of signals match one another,
wherein the selector circuit unit receives a first input signal and a second input signal, and selects one of the first and second input signals, and wherein the selection control circuit includes:
a first signal propagation circuit including a first switching circuit that is brought into conduction when levels of the first and second input signals match each other, and a first inverter circuit unit that is driven by the first switching circuit, wherein first inverter circuit unit inverts the selection signal to generate a first internal selection control signal;
an inverter circuit, connected to the first signal propagation circuit, for inverting the first internal selection control signal to generate a second internal selection control signal; and
a second signal propagation circuit, connected to the first signal propagation circuit and the inverter circuit, including a second switching circuit that is brought into conduction when the levels of the first and second input signal do not match each other, and a second inverter circuit unit that is driven by the second switching circuit, wherein the second inverter circuit unit inverts the second internal selection control signal to generate the first internal selection control signal.

4. The selector circuit of claim 3, wherein the first internal selection control signal output from the second signal propagation circuit is input as feedback into the inverter circuit.

5. The selector circuit of claim 3, wherein when the levels of the first and second input signals match each other, the selection control circuit drives the first inverter circuit unit in the first signal propagation circuit and stops driving of the second inverter circuit unit in the second signal propagation circuit, and propagates the selection signal and generates the first and second internal selection control signals.

6. The selector circuit of claim 3, wherein when the levels of the first and second input signals do not match each other, the selection control circuit drives the second inverter circuit unit in the second signal propagation circuit and stops driving of the first inverter circuit unit in the first signal propagation circuit, and interrupts propagation of the selection signal and maintains the first and second internal selection control signals until the levels of the plurality of signals match one another.

7. The selector circuit of claim 3, wherein the first switching circuit in the first signal propagation circuit includes:
a first transistor group that is formed by a plurality of series connected transistors that are controlled to be in a conducting state when the first and second input signals are both at a level corresponding to "0"; and
a second transistor group that is connected to the first transistor group and is formed by a plurality of series connected transistors that are controlled to be in a conducting state when the first and second input signals are both at a level corresponding to "1", and
wherein the first inverter circuit unit in the first signal propagation circuit is driven when the first or second transistor group is controlled to be in a conducting state.

8. The selector circuit of claim 3, wherein the second switching circuit in the second signal propagation circuit includes:
a third transistor group that is formed by a plurality of series connected transistors that are controlled to be in a conducting state when the first input signal is at a level corresponding to "0" and the second input signal is at a level corresponding to "1"; and
a fourth transistor group that is connected to the third transistor group and is formed by a plurality of series connected transistors that are controlled to be in a conducting state when the first input signal is at a level corresponding to "1" and the second input signal is at a level corresponding to "0", and
wherein the second inverter circuit unit in the second signal propagation circuit is driven when the third or fourth transistor group is controlled to be in a conducting state.

9. A semiconductor device comprising:
a selector circuit including:
a selector circuit unit for selecting one of a plurality of signals in accordance with a selection signal; and
a selection control circuit, connected to the selector circuit unit, for generating, when levels of the plurality of signals do not match one another, an internal selection control signal for controlling a selection operation of the selector circuit unit to maintain a state that is being selected in the selector circuit unit and not to perform a switching operation based on the selection signal until the levels of the plurality of signals match one another,
wherein the selection control circuit propagates the selection signal and generates an internal selection control signal having a level corresponding to the selection signal when the levels of the plurality of signals match one another, and interrupts propagation of the selection signal and maintains the level of the internal selection control signal to be provided to the selector circuit unit until the levels of the plurality of signals match one another when the levels of the plurality of signals do not match one another.

10. The semiconductor device of claim 9, wherein the internal selection control signal is one of two signals having levels complementary to each other, for causing one of the plurality of signals to be selectively output from the selector circuit unit.

11. A semiconductor device comprising:
a selector circuit including:
a selector circuit unit for selecting one of a plurality of signals in accordance with a selection signal; and
a selection control circuit, connected to the selector circuit unit, for generating, when levels of the plurality of signals do not match one another, an internal selection control signal for controlling a selection operation of the selector circuit unit to maintain a state that is being selected in the selector circuit unit and not to perform a switching operation based on the selection signal until the levels of the plurality of signals match one another, wherein the selector circuit unit receives a first input signal and a second input signal, and selects one of the first and second input signals, and wherein the selection control circuit includes:

a first signal propagation circuit including a first switching circuit that is brought into conduction when levels of the first and second input signals match each other, and a first inverter circuit unit that is driven by the first switching circuit, wherein first inverter circuit unit inverts the selection signal to generate a first internal selection control signal;

an inverter circuit, connected to the first signal propagation circuit, for inverting the first internal selection control signal to generate a second internal selection control signal; and a second signal propagation circuit, connected to the first signal propagation circuit and the inverter circuit, including a second switching circuit that is brought into conduction when the levels of the first and second input signal do not match each other, and a second inverter circuit unit that is driven by the second switching circuit, wherein the second inverter circuit unit inverts the second internal selection control signal to generate the first internal selection control signal.

12. The semiconductor device of claim 11, wherein the first internal selection control signal output from the second signal propagation circuit is input as feedback into the inverter circuit.

13. The semiconductor device of claim 11, wherein when the levels of the first and second input signals match each other, the selection control circuit drives the first inverter circuit unit in the first signal propagation circuit and stops driving of the second inverter circuit unit in the second signal propagation circuit, and propagates the selection signal and generates the first and second internal selection control signals.

14. The semiconductor device of claim 11, wherein when the levels of the first and second input signals do not match each other, the selection control circuit drives the second inverter circuit unit in the second signal propagation circuit and stops driving of the first inverter circuit unit in the first signal propagation circuit, and interrupts propagation of the selection signal and maintains the first and second internal selection control signals until the levels of the plurality of signals match one another.

15. The semiconductor device of claim 11, wherein the first switching circuit in the first signal propagation circuit includes:

a first transistor group that is formed by a plurality of series connected transistors that are controlled to be in a conducting state when the first and second input signals are both at a level corresponding to "0"; and a second transistor group that is connected to the first transistor group and is formed by a plurality of series connected transistors that are controlled to be in a conducting state when the first and second input signals are both at a level corresponding to "1", and wherein the first inverter circuit unit in the first signal propagation circuit is driven when the first or second transistor group is controlled to be in a conducting state.

16. The semiconductor device of claim 11, wherein the second switching circuit in the second signal propagation circuit includes:

a third transistor group that is formed by a plurality of series connected transistors that are controlled to be in a conducting state when the first input signal is at a level corresponding to "0" and the second input signal is at a level corresponding to "1"; and a fourth transistor group that is connected to the third transistor group and is formed by a plurality of series connected transistors that are controlled to be in a conducting state when the first input signal is at a level corresponding to "1" and the second input signal is at a level corresponding to "0", and wherein the second inverter circuit unit in the second signal propagation circuit is driven when the third or fourth transistor group is controlled to be in a conducting state.

* * * * *